United States Patent
Umemura et al.

[11] Patent Number: 5,783,925
[45] Date of Patent: Jul. 21, 1998

[54] METHOD OF INTERPOLATING OUTPUT FROM SENSOR

[75] Inventors: Chiaki Umemura, Toyohashi; Masanori Sugiyama, Nishio, both of Japan

[73] Assignee: Aisin Seiki Kabushiki Kaisha, Kariya, Japan

[21] Appl. No.: 796,891

[22] Filed: Feb. 5, 1997

[30] Foreign Application Priority Data

Feb. 5, 1996 [JP] Japan ............... 8-018779
Jan. 29, 1997 [JP] Japan ............... 9-015697

[51] Int. Cl.⁶ .................................... H02P 7/00
[52] U.S. Cl. .......................... 318/661; 324/207.12
[58] Field of Search ................... 318/632, 650, 318/651, 625–661; 324/207.11–207.26; 340/870.19, 870.3, 870.31, 870.2, 870.39, 870.4, 870.42, 870.34; 377/17, 23, 28, 30

[56] References Cited

U.S. PATENT DOCUMENTS

| | | | |
|---|---|---|---|
| 4,774,464 | 9/1988 | Kubota et al. | 324/207.25 |
| 4,897,647 | 1/1990 | Sakamoto et al. | 340/870.19 |
| 5,142,226 | 8/1992 | Sakamoto et al. | 324/207.24 |
| 5,208,535 | 5/1993 | Nakayama et al. | 324/318 |
| 5,300,879 | 4/1994 | Masuda et al. | 324/95 |
| 5,498,961 | 3/1996 | Kuhn et al. | 324/309 |

*Primary Examiner*—Jonathan Wysocki
*Attorney, Agent, or Firm*—Burns, Doane, Swecker & Mathis, LLP

[57] ABSTRACT

The period Tn needed to count a lowermost bit of a signal of which an absolute value of difference between a last real data θ(k) and a present real data θ(k+1) is assumed to be quantized in a data block period To is obtained. One digital quantity is successively accumulated on the present real data θ(k+1) every period Tn to obtain interpolation data C, D . . . . At the point t1 a final interpolation data G is adapted to be added or subtracted, the total of added or subtracted digital quantity exceeds the absolute value of difference. Accordingly, a final interpolation data G is held until a next real data θ(k+2) is output.

3 Claims, 2 Drawing Sheets

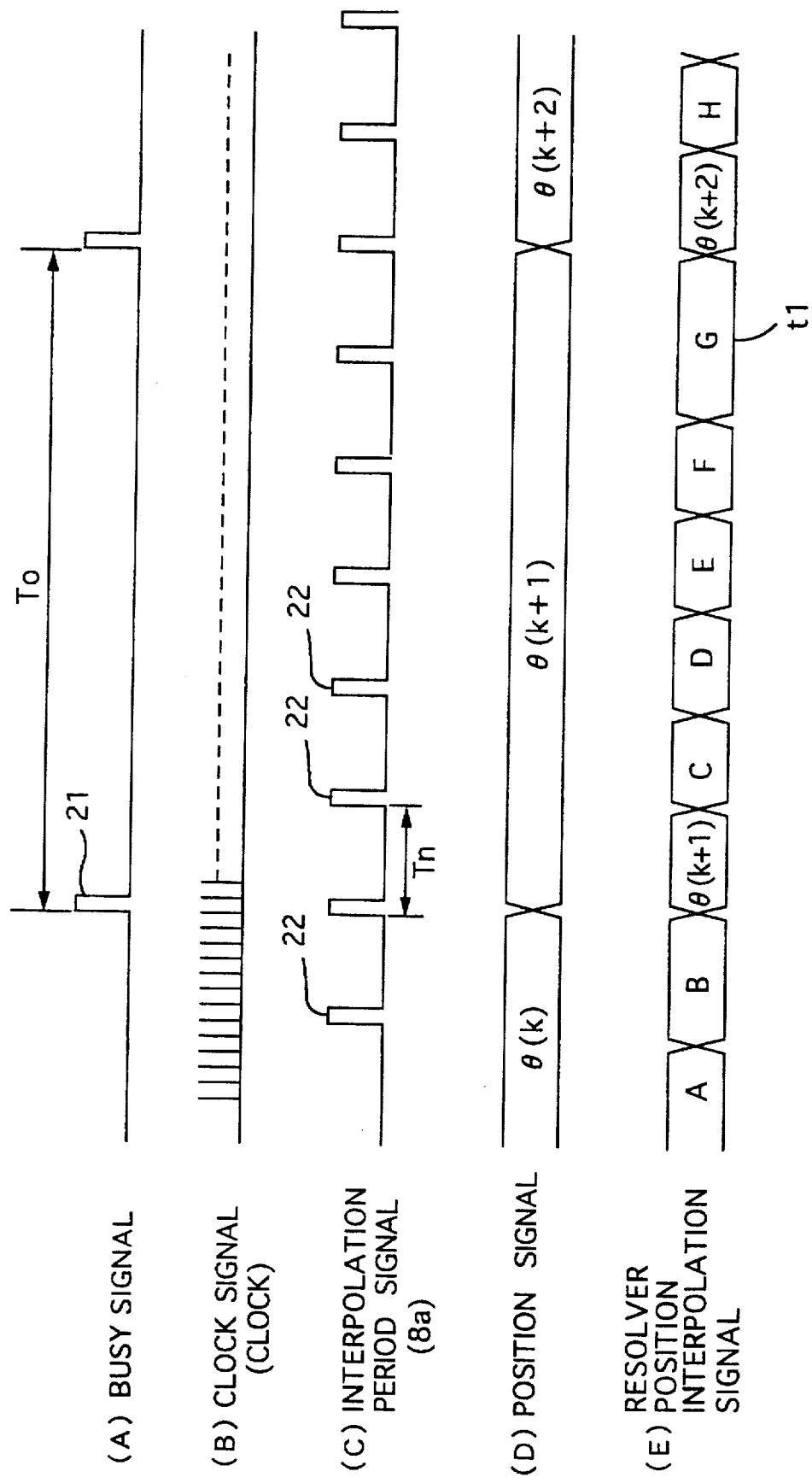

METHOD OF INTERPOLATING OUTPUT FROM SENSOR

BACKGROUND OF THE INVENTION

1. Field of the Invention

The present invention relates to an improvement in method of interpolating a digital signal sampled and output from a sensor device such as a resolver adapted to be attached to a rotary actuator such as a motor for driving an electric vehicle.

2. Description of Related Art

Recently, a sensor device outputting an analogue signal has been further provided with a circuit of converting the analogue signal into a digital signal, which samples the analogue signal and outputs the converted digital signal periodically to facilitate succeeding processing thereof.

A resolver adapted to detect a revolution angle of a motor as an analogue signal, for example, has a circuit called a resolver/digital (R/D) conversion circuit, which samples analogue revolution angle signal output from the resolver periodically, converts it into a digital signal and outputs the converted digital signal.

Thus, the output of the above circuit is a digital signal sampled at predetermined intervals and quantized. Resultant output data is discontinuous (discrete values) information. This discontinuity is especially remarkable in low-priced circuits. In a general resolver/digital (R/D) conversion circuit provided in the resolver, for example, revolution angle information is generally obtained merely about once every 250μ so that while the motor revolves at a great rate, an accurate determination of angular position thereof becomes difficult.

To obtain detail data, various methods of estimating data have been investigated. With these methods, an inclination or the like of succeeding data has been estimated based on real data obtained by a sensor at the present time (present value) and the past time (last value, for example) to perform linear approximation (linear interpolation). Accordingly, estimated data (interpolation values) may differ greatly from an immediately succeeding new real data (nest value), and the direction of variation from the last value to interpolation values via the present value may be opposite to that from the interpolation values to the next value.

In cases where real data represents revolution angle information, for example, estimated data (interpolation values) thereof may go ahead of a new real data (next value) in the direction of revolution, which results in false revolution angle information that the direction of revolution is reversed in a moment being output.

Further, in the conventional linearly interpolating method, interpolation values are output at predetermined intervals in the period between outputting points of the present value and next value. Accordingly, in the case of signals varying greatly, interpolation becomes rough, and in the case of signals scarcely varying, signal processing and outputting operation become redundant

SUMMARY OF THE INVENTION

Accordingly, it is an object of the present invention to provide a method of interpolating an output from a sensor, which overcomes defects of the conventional data estimating method using linear interpolation and enables a very accurate data estimation using linear interpolation with a simple arrangement.

In order to achieve this objective, there is provided an improved method of interpolating output form a sensor which includes steps of caluculating a present signal difference between a present value and a last value of a digital signal output periodically from a sensor device, calculating a present period between outputting points of said present value and said last value by counting clock pulses, calculating an interpolation value based on said present signal difference and said present period, outputting said interpolation value at a predetermined point in a next period between outputting points of said present value and a next value of said digital signal, calculating an interpolation interval defined as a value obtained by dividing said present period by one of an absolute value of said present signal difference and an approximate value thereof, calculating successively a plurality of interpolation values by either of adding and subtracting a value N (N is positive integers beginning with 1 and increasing successively) times as large as a counting unit of predetermined level of said present signal difference to or from said present value in a direction of addition or subtraction, which depends on a sign of said present signal difference, and outputting an Nth interpolation value when a period from said outputting point of said present value agrees with a value N times as large as said interpolation interval in said next period.

According to this method, when the present signal difference is great, a resulting interpolation interval decreases inversely, whereas when the present signal difference is small, a resulting interpolation interval increases inversely. When the present signal difference is 0, no interpolation operation is performed. Thus, the interpolation processing is performed in accordance with the magnitude of the present signal difference so that load on the interpolation processing can be reduced without deteriorating the interpolation accuracy.

Furthermore, since the interpolation interval is obtained by dividing the present period by the absolute value of the present signal difference or the approximate value thereof (binary signal), a large number of interpolation values can be calculated by merely adding or subtracting a value N times as large as a predetermined value to or from the present value, which enables simple operation of interpolation values.

Other objects, features, and characteristics of the present invention will become apparent upon consideration of the following description and the appended claims with reference to the accompanying drawings, all of which form a part of this specification.

BRIEF DESCRIPTION OF THE DRAWINGS

FIG. 2 is a timing chart showing operations of the circuit of FIG. 1.

DETAILED DESCRIPTION OF THE PRESENTLY PREFERRED EXEMPLARY EMBODIMENTS

Figure 1:
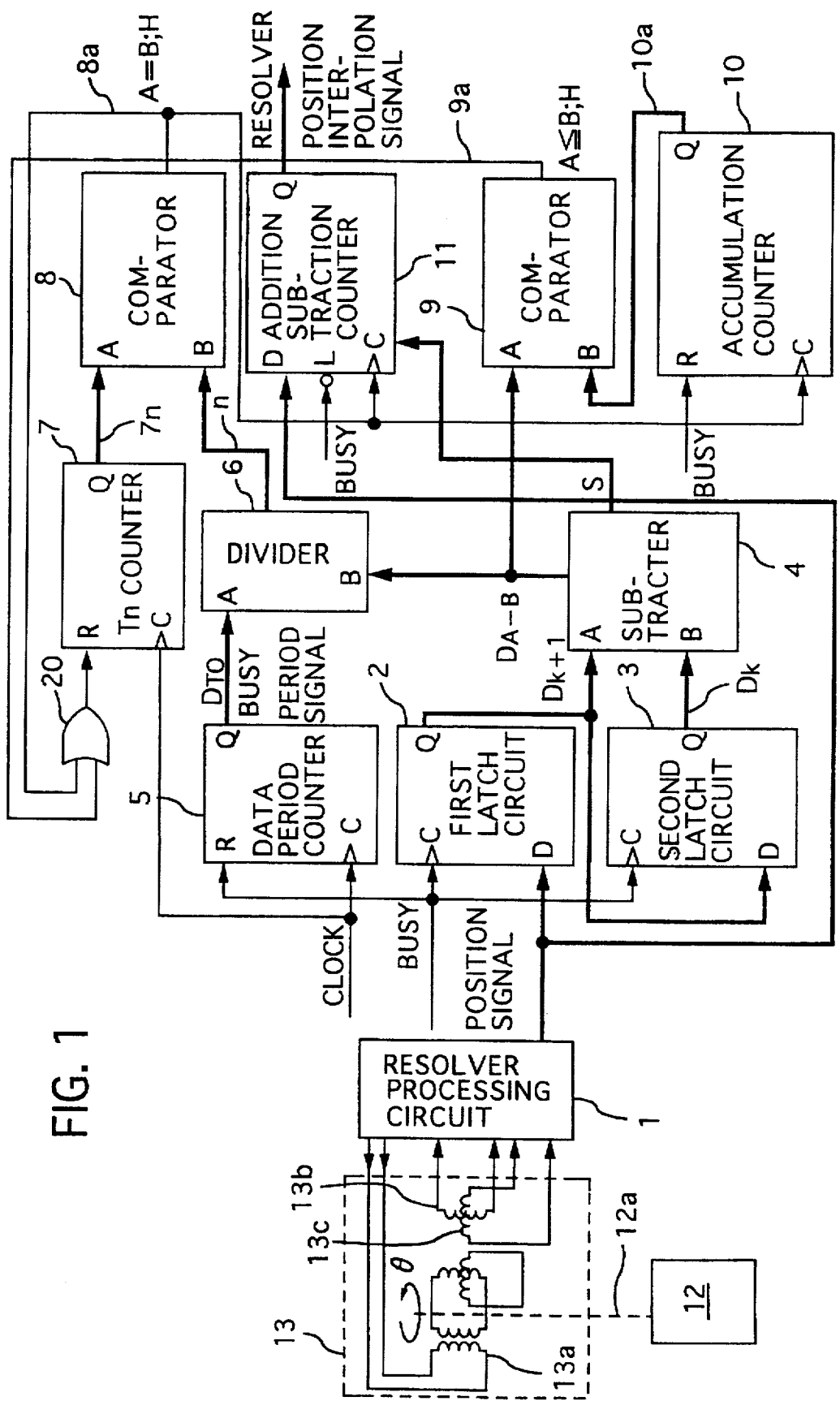
FIG. 1 is a block circuit diagram of an embodiment of a method of interpolating an output of a sensor in accordance with the present invention.

FIG. 1 is a block circuit diagram showing an embodiment of a method of interpolating an output of a revolution sensor in accordance with the present invention, which is applied to a resolver. As shown, reference numeral 12 denotes a motor as a driving source of an electric car, and a well known resolver 13 is secured to an output shaft 12a of the motor 12. The resolver 13 has an exciting (rotor) coil 13a and output (stator) coils 13b and 13c which are deviated from each other by an electric angle 90°. When a later-described resolver processing circuit 1 applies a sine wave voltage to the exciting coil 13a, a sine wave signal voltage and a cosine wave signal voltage which respectively vary in accordance with the revolution angle of the output shaft 12a of the motor 12 are induced in the output coils 13b and 13c, and the induced sine wave signal voltage and cosine wave signal voltage are applied to the resolver processing circuit (R/C conversion circuit) 1.

The resolver processing circuit 1 calculates a position signal as a digital signal of 12 bits, which represents the revolution angle, based on the sine wave signal voltage and cosine wave signal voltage with a predetermined constant sampling interval determined by counting a clock pulse of a clock signal CLOCK. The resolver processing circuit 1 outputs the position signal thus calculated along with a BUSY signal as a pulse signal representing the sampling timing.

The position signal is input to a data input terminal D of a first latch circuit 2 composed of an edge trigger flip-flop, while the BUSY signal is input to a trigger pulse input terminal C of the first latch circuit 2. The BUSY signal is also input to after pulse input terminal C of a second latch circuit 3 composed of an edge trigger flip-flop. An output of the first latch circuit 2 is applied to a data input terminal D of the second latch circuit 3. Thus, during one period of the BUSY signal, the first latch circuit 2 holds a present position signal $D_{k+1}$ (present value) detected at the present time and the second latch circuit 3 holds a last position signal $D_k$ (last value) detected at the last time. The first and second latch circuits 2 and 3 respectively output position signals $D_{k+1}$ and $D_k$ to a subtracter 4. The subtracter 4 subtracts the position signal $D_k$ from the position signal $D_{k+1}$, and calculates an absolute value of difference there between (absolute value of the present signal difference) $D_{A-B}$. The subtracter 4 is further provided with a sign outputting circuit of outputting a sign signal S of one bit, which represents a positive or negative sign of the present signal difference, in addition to subtracting circuit and absolute value circuit. The detailed illustration of the sign outputting circuit will be omitted.

The BUSY signal is also input to a reset terminal R of a data period counter 5. The data period counter 5 counts the clock pulse of the clock signal CLOCK after the BUSY signal is input, and outputs a BUSY period signal $D_{T_0}$ (present period). Accordingly, the BUSY period signal $D_{T_0}$ (present period) represents the interval between the outputting points of the position signal $D_k$ (last value) and position signal $D_{k+1}$ (present value).

The BUSY period signal $D_{T_0}$ and the signal of absolute value of difference $D_{A-B}$ are input to a divider 6. The divider 6 divides the BUSY period signal $D_{T_0}$ by the signal of absolute value of difference $D_{A-B}$, and outputs the time required for a binary signal representing the signal of absolute value of difference $D_{A-B}$ to vary by the value of the lowermost bit thereof (interpolation interval) as a counting value n of the clock pulse of the clock signal CLOCK. Namely, the counting value n of the clock pulse represents the time (interpolation interval) suited to vary the signal of absolute value of difference $D_{A-B}$ by the value of the lowermost bit with interpolation processing.

The counting value n of the clock pulse is compared with a counting value 7n output from an Tn counter 7 by a comparator 8. The Tn counter 7 counts the clock pulse of the clock signal CLOCK. An output 8a of the comparator 8 or an output 9a of a later-descried comparator 9 is input to the Tn counter 7 by way of an OR circuit 20. The Tn counter 7 is reset when the output 8a or 9a turns to a high level. The comparator 8 outputs a pulse 8a when the counting value 7n representing the counting time of the Tn counter 7 agrees with the counting value n representing the interpolation interval, which has been output from the divider 6. Accordingly, the interval of the pulse 8a corresponds to the interpolation interval. As described later, the comparator 9 outputs a pulse when a signal 10a representing an interpolation value to be added or subtracted to or from the position signal $ID_{K+1}$ exceeds the signal of absolute value of difference $D_{A-B}$.

The pulse 8a output from the comparator 8 is input to each clock input terminal C of an addition-subtraction counter 11 for interpolation processing and an L accumulation counter 10.

The addition-subtraction counter 11 is an edge trigger-type counter. The a resolver processing circuit 1 outputs a position signal to a data input terminal D of the addition-subtraction counter 11 and outputs a BUSY signal to a load control terminal L thereof. The addition-subtraction counter 11 thus arranged is a circuit adapted to calculate interpolation values, and includes an up-down counter. Upon inputting the BUSY signal to the load control terminal L of the addition-subtraction counter 11, a position signal (present value) is set. Then, every time a leading or trailing edge of the agreement output pulse 8a is input to the CLOCK input terminal C, one bit (one digital quantity), which means a value of one bit, is accumulatively added or subtracted, and a resulting interpolation value is output at a beginning of each interpolation interval.

The addition-subtraction counter 11 receives a sign signal S of one bit, which represents the sign, positive or negative, of the difference (present signal difference), from the subtracter 4, and determines based on the sign signal S whether the subtraction (count down) or addition (count up) should be performed. When the position signal $D_k$ (last value) is less than that $D_{k+1}$ (present value), the addition-subtraction counter 11 performs accumulative addition, and when the position signal $D_k$ (last value) is greater than that $D_{k+1}$ (present value), the addition-subtraction counter11 performs accumulative subtraction.

The BUSY signal is also input to a reset terminal R of the accumulation counter 10. The agreement output pulse 8a output from the comparator 8, which represents the beginning of each interpolation interval, is input to a count terminal of the accumulative counter 10. As described above, everytime a new interpolation interval begins (namely, the agreement output 8 is output), the addition-subtraction counter 11 outputs an interpolation value which varies by the value of one bit from its previous interpolation value. This results in the accumulation counter 10 outputting a counting value 10a which represents the difference between a presently outputting interpolation value and the position signal $D_{K+1}$ (present value) to the comparator 9 by counting the agreement output pulse 8a.

The comparator 9 compares the signal of absolute value of difference $D_{A-B}$ with the counting value 10a. When the counting value 10a becomes equal to the signal of absolute value of difference $D_{A-B}$, the comparator 9 inputs a high level signal to the reset terminal of the Tn counter 7 via the OR circuit 20. After that, the Tn counter 7 outputs 0, and accordingly, the comparator 8 does not output the agreement output pulse 8a, which results in that the addition-subtraction counter 11 does not vary the interpolation value to be output.

Hereinafter, the operation of the resolver interpolating circuit will be explained with reference to FIG. 2.

FIG. 2(A) shows the BUSY signal output from the resolver processing circuit 1. To denotes a data block interval of a position signal shown in FIG. 2(D). FIG. 2(B) shows a clock signal CLOCK.

During the period Tn after the outputting of a data θ(k+1) which is a present position signal (present value) representing an angle θ(k+1) from the resolver processing circuit 1 at the leading edge of the BUSY signal 21, a data θ(k+1) is held by the first latch circuit 2 and the data θ(k) is held by the second latch circuit 3. The angle θ(k)corresponds to a last position signal (last value).

The data θ(k+1) and θ(k) which are respectively held by the first latch circuit 2 and second latch circuit 3 are output to the subtractor 4, thus obtaining the signal of absolute value of difference $D_{A-B}$ between these data. The signal $D_{A-B}$ represents an angular variation between the present data θ(k+1) and last data θ(k).

The divider 6 divides the BUSY period signal $D_{To}$ input from the data period counter 5 by the signal of absolute value of difference $D_{A-B}$. Since the BUSY period signal $D_{To}$ is a digital value representing To, the divider 6 outputs the signal n showing To/ {θ(k+1)−θ(k)}.

The signal n represents the period needed to vary the lowermost bit of a binary signal showing the angular variation {θ(k+1)−θ(k)}, namely the interpolation interval. By counting the time which is equal to the interpolation interval defined as the signal n, as shown in FIG. 2(C), the interpolation interval Tn is determined as the period of an interpolation signal.

The Tn counter 7 and comparator 8 are adapted to obtain an interpolation period signal shown in FIG. 2 (C). This interpolation period signal corresponds to the agreement output pulse 8a output from the comparator 8 which compares the counting value 7n output from the Tn counter 7 with the signal n output from the divider 6. Namely, while the counting value 7n agrees with the signal n, the agreement output pulse 8a is turned to a signal 22 being a high level potential to reset the Tn counter 7. This results in the agreement output pulse 8a, namely the interpolation interval signal 22, being output repeatedly at intervals equal to the interpolation interval Tn.

Every time the agreement output pulse 8a is input, the addition-subtraction counter 11 adds (up-counts) or subtracts (down-counts) one bit to or from the present position signal. The counting direction of the addition-subtraction counter 11, namely whether one bit should be added or subtracted, is determined in consideration that the data is under decreasing or increasing. Thus, the addition-subtraction counter 11 outputs a resolver position interpolation signal (interpolation values) shown in FIG. 2(E).

As shown in FIG. 2 (E), the addition-subtraction counter 11 directly outputs a digital signal corresponding to the present value θ(k+1) as a resolver position interpolation signal (interpolation value) in a fist interpolation interval Tn immediately after the BUSY signal is output. In a second interpolation interval Tn, the addition-subtraction counter 11 outputs a digital signal corresponding to the angle of θ(k+1)+{θ(k+1)−θ(k)} /(To/Tn) as a resolver position interpolation signal (interpolation value) C. The interpolation value C is equal to the signal obtained by adding or subtracting the value of the lowermost bit to or from the digital signal of the present value. In the next interpolation interval Tn, the addition-subtraction counter 11 outputs a digital signal corresponding to the angle of θ(k+1)+2{θ(k+1)−θ(k)} /(To/Tn) as a resolver position interpolation value (interpolation value) D. The interpolation value D is equal to the signal obtained by double adding or subtracting the value of the lowermost bit to or from the digital signal of the present value.

The above-described interpolation processing in accordance with the present invention is executed until the output signal 10a of the accumulation counter 10 adapted to count the agreement output pulse 8a agrees with the signal of absolute value of difference $D_{A-B}$ output from the subtractor 4. If the interpolation processing is performed i times, in the case of FIG. 2, the data G of a final resolver position interpolation signal (interpolation value) corresponds to the angle of θ(k+1)+i{θ(k+1)−θ(k) } /(To/Tn).

When the final data G is output from the accumulation counter 10 and the agreement output pulse 8a is further output at the point t1, the signal 10a output from the accumulation circuit 10 exceeds the signal of absolute value $D_{A-B}$.

The comparator 9 detects the excess of the signal 10a over the signal of absolute value $D_{A-B}$ to change the output 9a into a signal being a high level potential. This results in the Tn counter 7 being continuously reset thereafter to block rising of the agreement output 8a in the comparator 8. Thus, the data G of the resolver position interpolation signal (interpolation value) is held until a next position signal θ(k+2) (next value) corresponding to the angle θ(k+2) is obtained.

With this embodiment, following operational advantages are achieved.

The digital signal output periodically from the sensor device normally varies approximately linearly with a short period, and accordingly, a next signal difference between the present value and a next value is approximately equal to the present signal difference between the last value and the present value. When the signal-variation rate changes suddenly, the next signal difference differs from the present signal difference. More accurate calculation of interpolation values can be performed by the data estimation using a differential coefficient or the like of the signal-variation rate. The data estimation, however, requires complex and many operations.

Accordingly, with the present preferred embodiment, when an interpolation value exceeds a next value estimated by linear interpolation based on the last value and the present value, the judgment that the signal-variation rate suddenly changed is made to interrupt a further increase or decrease of the interpolation value. This arrangement prevents the interpolation value from exceeding or overshooting greatly the next value estimated, thus restraining excessively great signal variation between a final interpolation value in a next period and the next value.

When the interpolation processing is performed at intervals while the absolute value (digital signal) of difference between the present value and the last value varies by the unit digital quantity, there can be achieved an advantage that if such digital signal varies linearly, the present value, next value and interpolation values forming between the two values can be arranged at equal intervals.

The preceding embodiment is merely one example of embodiments of the present invention. In accordance with the present invention, any arrangement of the interpolation circuit other than that shown in FIG. 1 is possible.

While the invention has been described in connection with what are considered presently to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of interpolating output from a sensor comprising steps of:

calculating a present signal difference between a present value and a last value of a digital signal output periodically from a sensor device;

calculating a present period between outputting points of said present value and said last value by counting clock pulses;

calculating an interpolation value based on said present signal difference and said present period;

outputting said interpolation value at a predetermined point in a next period between outputting points of said present value and a next value of said digital signal;

calculating an interpolation interval defined as a value obtained by dividing said present period by one of an absolute value of said present signal difference and an approximate value thereof;

calculating successively a plurality of interpolation values by either of adding and subtracting a value N (N is positive integers beginning with 1 and increasing successively) times as large as a counting unit of predetermined level of said present signal difference to or from said present value in a direction of addition or subtraction, which depends on a sign of said present signal difference; and outputting an Nth interpolation value when a period from said outputting point of said present value agrees with a value N times as large as said interpolation interval in said next period.

2. A method as claimed in claim 1, wherein said interpolation interval is calculated by dividing said present period by said absolute value of said present signal difference, and said a plurality of interpolation values are calculated successively by either of adding and subtracting a value N (N is positive integers beginning with 1 and increasing successively) times as large as a minimum counting unit of said present signal difference to or from said present value in a direction of either of addition and subtraction, which depends on said sign of said present signal difference.

3. A method as claimed in claim 1, wherein after said value N times as large as said counting unit exceeds said absolute value of said present signal difference, one of said a plurality of interpolation values, which is output immediately therebefore, is output until said next value is output.

* * * * *